(12) United States Patent
Bandyopadhyay et al.

(10) Patent No.: US 11,113,337 B2
(45) Date of Patent: Sep. 7, 2021

(54) METHOD FOR IMPUTING MISSED DATA IN SENSOR DATA SEQUENCE WITH MISSING DATA

(71) Applicants: Indian Institute of Technology Bombay, Mumbai (IN); Tata Consultancy Services, Kolkata (IN)

(72) Inventors: Soma Bandyopadhyay, Kolkata (IN); Krithivasan Ramamritham, Mumbai (IN)

(73) Assignees: INDIAN INSTITUTE OF TECHNOLOGY BOMBAY, Mumbai (IN); TATA CONSULTANCY SERVICES, Kolkata (IN)

( * ) Notice: Subject to any disclaimer, the term of this patent is extended or adjusted under 35 U.S.C. 154(b) by 409 days.

(21) Appl. No.: 15/698,911

(22) Filed: Sep. 8, 2017

(65) Prior Publication Data

US 2018/0068033 A1    Mar. 8, 2018

(30) Foreign Application Priority Data

Sep. 8, 2016  (IN) .............................. 201621030751

(51) Int. Cl.
*G01R 22/10* (2006.01)
*G06N 5/02* (2006.01)
*G06F 16/903* (2019.01)
*G06N 20/00* (2019.01)
*G06F 3/05* (2006.01)

(52) U.S. Cl.
CPC ....... *G06F 16/90348* (2019.01); *G01R 22/10* (2013.01); *G06N 5/022* (2013.01); *G06N 20/00* (2019.01); *G06F 3/05* (2013.01)

(58) Field of Classification Search
CPC .......... G06N 20/00; G06N 5/022; G06N 3/08; G06N 20/10; G01R 22/10; G06F 16/90348; G06F 3/05; G06F 11/3466; G06F 11/3476; G06F 17/40
USPC ........................................................ 702/187
See application file for complete search history.

(56) References Cited

U.S. PATENT DOCUMENTS

| | | | |
|---|---|---|---|
| 2008/0126274 A1* | 5/2008 | Jannarone ................ | G06N 3/08 706/12 |
| 2013/0226613 A1* | 8/2013 | Srinivasan ............. | G06Q 50/24 705/3 |
| 2013/0226842 A1* | 8/2013 | Chu ....................... | G06N 20/00 706/12 |
| 2014/0207493 A1* | 7/2014 | Sarrafzadeh ........... | G16H 50/20 705/3 |
| 2017/0055913 A1* | 3/2017 | Bandyopadhyay .. | A61B 5/0402 |

(Continued)

*Primary Examiner* — Michael P Nghiem

(57) ABSTRACT

Embodiments herein provide a method for imputing sensor data, in a sensor data sequence with missing data based on the semantics learning, where semantics is defined by the constraints of the sensor data features. A candidate value for imputation is determined based on sensor data of corresponding instances of time instants of the sensor data sequence using learning based on semantics of features of the sensor data sequence with missing data. The nearest neighbors search has been applied in similar response data sequence using the data values corresponding to the time instant of missing data in sensor data sequence. In case similar response data sequence is not available imputation is performed based on the distribution pattern of missing data.

10 Claims, 4 Drawing Sheets

(56) References Cited

U.S. PATENT DOCUMENTS

2017/0185902 A1\* 6/2017 Kumar .................. G06Q 10/04
2019/0378022 A1\* 12/2019 Wang ..................... G06F 17/17

\* cited by examiner

METHOD FOR IMPUTING MISSED DATA IN SENSOR DATA SEQUENCE WITH MISSING DATA

FIELD OF INVENTION

The embodiments herein relate to computational analytics and more particularly to method for imputing missed data in a sensor data with missing data. The present application is based on, and claims priority from an Indian Application Number 201621030751 filed on 8 Sep. 2016 the disclosure of which is hereby incorporated by reference herein.

BACKGROUND OF INVENTION

Missing data imputation is an essential requirement of sensor data analytics in order to retrieve essential information from the missed part and building intelligent systems. Imputing missed sensor data is crucial for determining behavior of a system over a period of time. It is hard, to obtain previous history of the sensor data and thereafter utilize the previous history of the sensor data for estimating the missing sensor data.

The conventional methods provide means for extracting the most informative data parameters from a data set. Missing data may cause some important information loss during the process of information extraction. Convention methods mostly estimate missing data based on history or past knowledge of the data to estimate the missed value.

Missing data is highly undesirable in such sectors as healthcare leveraging sensor technology and wireless communication monitoring the health status of patients. If the data from the sensors, triggers alarms about the health status, are missed, then the alarms may fail to alert healthcare professionals about a potentially dangerous condition. A similar example can be stated by considering smart infrastructure, in which a critical event may happen due to failure of a device. In general, it is difficult to obtain the previous history of data generated by the different sensors.

Thus, there is a need for having a method which allows imputing the missing sensor data without using (or using as least as possible of) the previous history of the sensor data.

The above information is presented as background only to help the reader for understanding the present invention. Applicants have made no determination and make no assertion as to whether any of the above might be applicable as Prior Art with regard to the present application.

OBJECT OF INVENTION

The principal object of the embodiments herein is to provide a method for imputing missed data in a sensor data sequence with missing data value, with reduced imputation errors.

Another object of the embodiments herein is to provide a method for performing semantics leaning in order to estimate the missing data value while minimizing the imputation error.

Another object of the embodiments herein is to provide a method for imputing missing sensor data without using previous history of the sensor data.

Another object of the embodiments herein is to provide a method for imputing missing sensor data using previous history of the sensor data as least as possible.

Another object of the embodiments herein is to provide a method for imputing missed sensor data through data estimated from the sensor data sequence with missing data value itself.

Another object of the embodiments herein is to provide a method for imputing missing data based on the distribution pattern of missing data.

Another object of the embodiments herein is to provide a method for imputing missing data using Missing Completely at Random (MCAR) mechanism and Missing at Random (MAR) mechanism.

SUMMARY

Accordingly embodiments herein provide method for imputing missed data value in a sensor data sequence having missing data, with reduced reconstruction errors. The method includes identifying a time instant of missing sensor data value associated with a sensor data sequence (S). The method includes identifying a similar response data sequence (SR), which corresponds to the sensor data sequence. The identification of the similar response data sequence is based on order of correlation between the similar response data sequence and the sensor data sequence. The similar response data sequence possesses the highest correlation with respect to the sensor data sequence (S) in comparison with other data response sequences. The method includes identifying a data value at a time instant associated with the similar response data sequence (SR) corresponding to the time instant of the missing data value associated with the sensor data sequence. The method includes determining nearest neighbors of the identified data at the time instant associated with the missing data in similar response data sequence (SR). The data values of the nearest neighbors are within a predetermined nearness threshold. The time instant (Tm) of the data value associated with the similar response data sequence corresponds to the time instant of missing data value associated with the sensor data sequence. The method includes identifying instances of time instants in the sensor data sequence corresponding to the instances of time instants of the nearest neighbors in the similar response data sequence. The method includes determining a candidate value for imputation of missing data, based on sensor data values at corresponding instances of time instants (Tm) in the sensor data sequence (S) using learning based on semantics of features of the data of the sensor data sequence (S). The method includes imputing the candidate value in the instances of time instants of missing data in the sensor data sequence based on the data value of the corresponding instances of time instants (Tm) of the sensor data sequence.

In an embodiment, the nearest neighbors in the similar response data sequence is determined based on the distances of data values of the time instant (Tm) in the similar response data sequence. The nearest neighbor data value in the similar response data sequence (SR) is obtained by applying a nearest neighbor search using the data in SR corresponding to the time instant of the missing data value in the sensor data sequence i.e., (Tm). The data value of each of the nearest neighbors is compared with the identified data value for obtaining the distance. In an embodiment, by measuring the Euclidean distance the distance between each of the nearest neighbor data value and the identified data value is obtained. It is to be understood that any other relevant metric can be used for obtaining this distance. In an embodiment, the distance between the data value of each nearest neighbor and the identified data value is below the predetermined nearness threshold.

In an embodiment, the candidate value for imputation is determined through learning based on semantics of the features of the data of the sensor data sequence (S). The semantics are defined based on constrains imposed on the features of the sensor data. In an embodiment, the feature corresponds to the candidate value falling within a maximum possible data value and a minimum possible data value of the sensor data sequence. In another embodiment, the feature corresponds to the candidate value falling within a range associated with the maximum possible value and the minimum possible value.

In an embodiment, the feature of the candidate value for imputation corresponds to a distribution pattern and the constraint imposed on the distribution pattern. The constraint corresponds to the sensor data in the distribution pattern not having a minimum value for at least three consecutive instances of time instants in the sensor data sequence. The method includes determining the measure of convergence of the candidate value associated with a particular time instant with the data value of preceding time instant and succeeding time instant. The method includes imputing the candidate value in the instance of the time instants of the missing data value in sensor data sequence.

In an embodiment, the method includes determining whether the candidate value for imputation is identical to the minimum value of the sensor data sequence. The method includes computing an average of the data value considering at least three consecutive data values like data value of preceding instance of time instants with respect to the instance of time instants of the missed data value, and the data value of succeeding instance of time instants with respect to the instance of time instants of the missed data value (denoted by A); in response to determining that the candidate value is identical to the minimum value of the sensor data sequence considering at least three consecutive instances of time instants in the sensor data sequence. The method includes imputing the average value 'A' at the time instant of the missing data value associated with the sensor data sequence.

Accordingly embodiments herein provide a method for imputing missing data values in a sensor data sequence. In another embodiment the method includes determining that missing data values in the sensor data sequence are independent of the other observed sensor data values. The method includes determining whether pattern of the missing data values corresponds to a periodic pattern or an arbitrary pattern. The method includes selecting linear interpolation for imputing the missing data values in response to determining that the pattern of the missing data values is arbitrary. The method includes selecting nearest neighbor interpolation for imputing the missing data values in response to determine that the pattern of the missing data values is periodic.

Accordingly the embodiments herein provide a computer program product comprising computer executable program code recorded on a computer readable non-transitory storage medium where the computer executable program code when executed causing the actions which includes identifying a time instant associated with the missing sensor data value in a sensor data sequence. Further, the computer executable program code when executed causing the actions which includes identifying a similar response data sequence, which corresponds to the sensor data sequence. Further, the computer executable program code when executed causing the actions which includes identifying a data value at a time instant associated with the similar response data sequence corresponding to the time instant of the missing data value associated with sensor data sequence. Further, the computer executable program code when executed causing the actions which includes determining nearest neighbors in the similar response data sequence based on the data value of the time instant associated with the similar response data sequence. Further, the computer executable program code when executed causing the actions which includes determining instances of time instants of the determined nearest neighbors data in the similar response data sequence. Further, the computer executable program code when executed causing the actions which includes identifying corresponding instances of time instants in the sensor data sequence which are associated with the instances of time instant of the nearest neighbors in the similar response data sequence. Further, the computer executable program code when executed causing the actions which includes determining a candidate value for imputation, based on sensor data values of corresponding instances of time instants in the sensor data sequence using learning based on semantics of features of the data values of the sensor data sequence. Further, the computer executable program code when executed causing the actions which includes imputing the candidate value in the instance of time instants of the missing data value in the sensor data sequence based on the data value of the corresponding instances of time instants of the sensor data sequence.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
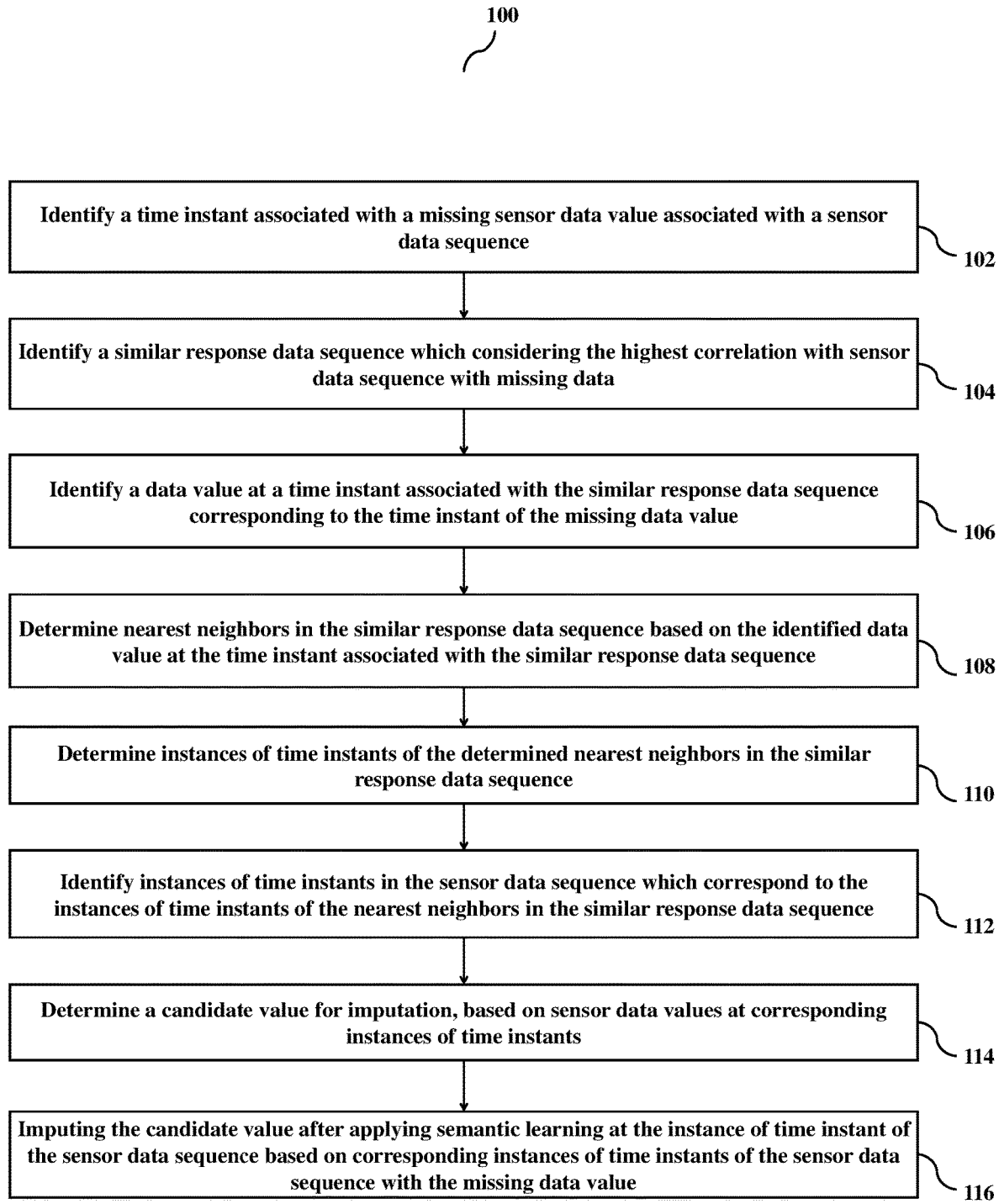
FIG. 1 is a flowchart depicting a method for imputing sensor data in a sensor data sequence with missing data, considering the observed data according to the embodiments as disclosed herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

Accordingly embodiments herein provide a method for imputing data value in a sensor data sequence with missing data value, with reduced imputation errors. The method includes identifying a time instant associated with the missing sensor data value in a sensor data sequence. The method includes identifying a similar response data sequence, which corresponds to the sensor data sequence. The identification of the similar response data sequence is based on correlation between the similar response data sequence and the sensor data sequence. The similar response data sequence has the highest correlation with respect to the sensor data sequence in comparison with other data response sequences. The method includes identifying a data value at a time instant associated with the similar response data sequence corresponding to the time instant of the missing data value associated with the sensor data sequence. The method includes determining nearest neighbors in the similar response data sequence based on the data value at the time instant associated with the similar response data sequence. The data values of the nearest neighbors are within a predefined nearness threshold. The time instant of the data value associated with the similar response data sequence (SM) corresponds to the time instant (Tm) with missing data value associated with the sensor data sequence. The method includes determining instances of time instants of the nearest neighbors in the similar response data sequence. The method includes identifying corresponding instances of time instants in the sensor data sequence(S). These instances of time instants are associated with the instances of time instants of the nearest neighbors in the similar response data sequence (SM). The method includes determining a candidate value for imputation, based on sensor data values of corresponding instances of time instants in the sensor data sequence using learning based on semantics of features of the data values of the sensor data sequence. The semantics are defined based on constraints imposed on the features of the sensor data value. The method includes imputing the candidate value in the instances of time instants of missing data value in the sensor data sequence based on data value of corresponding instances of time instants of the sensor data sequence.

In an embodiment, the proposed method performs imputation of the missing data values using semantics learning. The proposed method identifies the semantics of the features of the sensor data values of the sensor data sequence. The semantics of the features of the sensor data indicate various constraints imposed by a user or an application. The semantics describe various constraints of features such as statistical properties and distribution pattern of the sensor data having any window length 0 to length of the sensor data sequence. The proposed method determines a best-fit threshold based on semantics of distribution pattern, in terms of deviation of two immediate neighbors of a minima point. The proposed method includes applying semantic based learning of the features in order to impute the missing data.

In an embodiment, the proposed method allows imputing missing data values in a sensor data sequence based on pattern of the missing sensor data and the sensor signal dynamics, in which missing data values in the sensor data sequence are independent of the observed data values of the sensor data sequence.

Unlike conventional methods, the proposed method addresses the problem of imputing missing sensor data without utilizing sensor data history. The proposed method does not utilize the sensor data history in order to estimate the missing data in the sensor data sequence. The proposed method allows imputing the missing data using Missing Completely at Random (MCAR) mechanism and Missing at Random (MAR) mechanism. The proposed method allows imputing missing sensor data based on the pattern of the missing data value when the observable data value is not considered for imputing missing data value, falling in the category of MCAR.

Referring now to the drawings and more particularly to FIGS. 1 through 4, where similar reference characters denote corresponding features consistently throughout the figures, there are shown preferred embodiments.

FIG. 1 is a flowchart 100 depicting a method for imputing sensor data in a sensor data sequence with missing data considering the observed data, according to the embodiments as disclosed herein.

At step 102, the method includes identifying a time instant associated with the missing sensor data associated with a sensor data sequence. Considering an exemplary scenario, in which the sensor data sequence is a data sequence generated by a smart energy meter. The smart energy meter measures the power consumption and generates data every 30 seconds.

At step 104, the method includes identifying a similar response data sequence, considering the highest correlation with sensor data sequence with missing data. The proposed method identifies the similar response data sequence through a correlation technique. The proposed method determines the correlation between the sensor data sequence and other data sequences. The identification of the similar response data sequence is based on the fact that the correlation between the similar response data sequence and the sensor data sequence, with missing data value, is highest in comparison with the correlation of other data response sequences. In an example, a data sequence indicating electrical current (I) in case of smart energy is identified as the similar response sequence. The measurement of current (I) is also performed every 30 seconds. The data corresponds to current is identified as the similar response data sequence by comparing the correlation of the current (I) data and the correlation of other observed data sequences indicating responses such as temperature, load, or the like, with respect to the data sequence generated by a smart energy meter indicating electrical power consumption.

At step 106, the method includes identifying a data value at a time instant associated with the similar response data sequence corresponding to the time instant of the missing data value associated with the sensor data sequence with missing data. The time instant of the identified data value is same as the time instant with missing data value in the sensor data sequence. Considering the following table:

TABLE 1

| Data values at different time instants |  |  |  |
|---|---|---|---|
| Sensor data sequence |  |  |  |
| T1 | T2 | T3 | T4 |
| a | — | c | d |

As depicted in the table 1, the sensor data sequence is having a missing entry at the time instant T2. Considering the following table:

TABLE 2

Data values at different time instants

Similar response data sequence

| T1 | T2 | T3 | T4 |
|----|----|----|----|
| e  | f  | g  | h  |

Once the similar response data sequence is identified, the proposed method includes identifying the data value 'f' at the time instant T2. The time instant (T2) of the data value 'f' in the similar response data sequence corresponds to the time instant (T2) of the sensor data sequence with the missing entry (Table 1).

Considering the exemplary case of smart energy where consumed electric power which has the missed data and the electric current (I) which has been considered as similar response data as both show a high co-relation, the current (I) value is measured at $0^{th}$ time instant, $30^{th}$ time instant, $60^{th}$ time instant, and so on. Similarly, the power consumption also recorded at $0^{th}$ time instant, $30^{th}$ time instant, $60^{th}$ time instant, and so on.

In light of this example, considering that the proposed method identifies that at $60^{th}$ time instant, the smart energy meter data is missing and also some other instances of time instants, it has missed values such as $90^{th}$ time instant, $150^{th}$ time instant, or the like. The proposed method thereby identifies the value of current (I) at the $60^{th}$ time instant, $90^{th}$ time instant, 150th time instant, or the like. The identified current value at the $60^{th}$ time instant is considered, in an example, to be 40 A, for $90^{th}$ time instant, it is considered to be 50 A, and at the $150^{th}$ time instant it is considered to be 70 A.

At step 108, the method includes determining nearest neighbors in the similar response data sequence based on the identified data values at the time instants associated with the similar response data sequence. In an embodiment, the nearest neighbors in the similar response data sequence are determined based on the distances of data values at the time instants of the similar response data sequence, which in turn corresponds to the time instants of the missing data in the sensor data sequence. The nearest neighbors in the similar response data sequence is determined based on the distances of data values of the time instant (Tm) in the similar response data sequence. The identified nearest neighbor data in the similar response data sequence is obtained by applying a nearest neighbor search using the data corresponding to the time instants of the missing data in the sensor data sequence i.e., (Tm). The data values of each of the nearest neighbors are compared with the identified data values for obtaining the distance. In an embodiment, the distance of each nearest neighbor data value with the identified data value is obtained by measuring the Euclidean distance. It is to be understood that any other relevant metric can be used for obtaining this distance. In an embodiment, the distance between the data value of each nearest neighbor and the identified data value is below the predetermined nearness threshold. The data value of nearest neighbor is considered as identified data value in the similar response data sequence. Considering the above example, the proposed method determines nearest neighbors, in the current (I) response sequence, having current (I) value 40 A at the $60^{th}$ time instant, where smart energy meter has a missed value at that time instant. The current samples with distances close to 40 A are the nearest neighbors, and similarly for current value 50 A at $90^{th}$ time instant and current value 70 A at $150^{th}$ time instant.

The nearest neighbors are within a predefined nearness threshold. If the nearness threshold is considered as 3, which implies that 3 nearest neighbors are identified, and among them the closest or all 3 nearest neighbors for each data value are to be considered. The current (I) samples having current value between 38 A and 45 A are considered as nearest neighbors, 38 A, 44 A and 45 A the 3 nearest neighbors of 40 A are considered. The nearness threshold is a predefined value signifies number of nearest neighbors. Therefore considering the above example, in one exemplary case nearest neighbors are identified based on the current value at the $60^{th}$ time instant, which in turn corresponds to the $60^{th}$ time instant of the smart energy meter's electrical power consumption data sequence having a missing data value.

At step 110, the method includes determining instances of time instants of the determined closest or all nearest neighbors in the similar response data sequence. Considering the above example, the proposed method determines the instances of time instants of the nearest neighbors in the current (I) response, i.e., instances of time instants of the current samples having current values as 38 A, 44 A, 45 A. Considering the above example the proposed method determines that at the $30^{th}$ time instant the current value is 38 A and at the $120^{th}$ time instant the current value is 42 A, $150^{th}$ time instant 45 A. Therefore, the determined instances of time instants are the $30^{th}$ time instant and the $120^{th}$ time instant and $150^{th}$ time instant.

At step 112, the method includes identifying instances of time instants in the sensor data sequence corresponding to the instances of time instants of the nearest neighbors in the similar response data sequence. Considering the above example, the proposed method identifies data values at the $30^{th}$ time instant and the $120^{th}$ time instant, $150^{th}$ time instant of the data sequence generated by the smart energy meter. The candidate value for imputation is based on the data values at the $30^{th}$ time instant or the $120^{th}$ time instant, or the $150^{th}$ time instant. In one exemplary case considering 3 nearest neighbors and considering the nearest one the candidate data value for imputation is based on the data value of $30^{th}$ time instant. The above example is herein depicted in a tabular form. Table 3 depicts the data values generated by the smart energy meter, which is considered as the sensor data sequence with missing data. Table 4 depicts the data values of the current response, which is considered as the similar response data sequence.

Considering the following table:

TABLE 3

Data values at different time instants

Smart Energy data sequence (W)

| $0^{th}$ instant | $30^{th}$ instant | $60^{th}$ instant | $120^{th}$ instant | $150^{th}$ instant |
|---|---|---|---|---|
| 114 | 137 | — | 152 | 153 |

As depicted in the table, the data sequence generated by the smart energy meter is having a missing value at the $60^{th}$ time instant. Considering the following table:

TABLE 4

Data values at different time instants

Current response data sequence (A)

| $0^{th}$ instant | $30^{th}$ instant | $60^{th}$ instant | $120^{th}$ instant | $150^{th}$ instant |
|---|---|---|---|---|
| 17 | 38 | 40 | 44 | 45 |

Once the proposed method identifies the instances of time instants of the nearest neighbours, i.e., $30^{th}$ time instant and the $120^{th}$ time instant, $150^{th}$ time instant, the proposed method determines the corresponding instances of time instants ($30^{th}$ time instant, the $120^{th}$ time instant, and $150^{th}$ time instant) in the data sequence generated by the smart energy meter.

At step 114, the method includes determining a candidate value for imputation, based on sensor data values at corresponding instances of time instants like $30^{th}$ time instant based on the above exemplary case in the smart energy meter data sequence, with the missing data value, and on the basis of learning based on semantics of features of the data values of the sensor data sequence. Considering the above example, the data values at the $30^{th}$ time instant and the $120^{th}$ time instant, $150^{th}$ time instant of the data sequence generated by the smart energy meter are 137 W, 152 W, 134 W as shown in table 5 are considered for determining the candidate value.

The semantics are defined based on constrains imposed on the features of the candidate value. In an embodiment, the feature corresponds to the candidate value falling within a maximum possible value and a minimum possible value. The maximum possible value and the minimum possible value are based on the maximum limit and the minimum limit respectively, of the data values that can be generated by the smart energy meter. In an example, if the maximum limit is 180 W and the minimum limit is 0 W, then the candidate value lies within the range of 0 W and 180 W. In an example, the range associated with the maximum possible value can be 160 W-180 W and the range associated with the minimum possible value can be 0 W-25 W.

In an embodiment, the feature of the candidate value for imputation corresponds to a distribution pattern and the constraint imposed on the distribution pattern. In one exemplary case the constraint corresponds to the distribution of sensor data (S) not having a minimum value for at least three consecutive instances of time instants in the sensor data sequence. Considering the above example, if the candidate value is based on the $30^{th}$ time instant of the data sequence generated by the smart energy meter, considering the least distance among three nearest neighbors and the corresponding time instant as an exemplary case, then the method ensures that three consecutive data values do not have a minimum value in between.

The method includes determining the measure of convergence of the candidate value with the data value at preceding time instant and succeeding time instant. The method includes imputing the candidate values in the instances of time instants associated with the sensor data sequence with missing data.

In an embodiment, the method includes determining whether the candidate value for imputation based on the data value of the corresponding time instant of nearest neighbor is identical to a minimum data value of the sensor data sequence with missing value, and at least three consecutive data values do not have minimum value in between. Considering the above example, the method determines whether the candidate value is 0 W. If the method determines that the candidate value is minimum, and its preceding and succeeding values are not the minimum value of sensor data sequence i.e., 0 W in this case then the method includes a best fit threshold by following the semantics learning. It computes an average of the data values of at least the preceding instance of time instants and succeeding instance of time instants with respect to the instance of time instants of the missed data value, in response to determining that the candidate value of imputation following the semantic learning of data distribution, as an exemplary case whenever the candidate value becomes identical to the minimum data value of the sensor data sequence. Considering the above example, if the method determines that the candidate value for imputation considering the data value at $30^{th}$ time instant is 0 W, then the method computes the average of the data values generated by the smart energy meter at the $30^{th}$ time instant and the $90^{th}$ time instant the preceding and succeeding instances of time instants of $60^{th}$ time instant having missed data. However following the above case it is 137 W.

At step 116, the method includes imputing the candidate value after applying semantic learning based on the distribution of sensor data and data value of corresponding instances of time instants of the sensor data sequence with the missing data value. Considering the above example, the method allows imputing the candidate value at the $60^{th}$ time instant of the data sequence generated by the smart energy meter, in which the candidate value is based on the data value 137 W at the $30^{th}$ time instant. Here, 137 W is not the minimum value and the immediate preceding and succeeding values do not have also minimum values in this case.

TABLE 5

Data value imputation

Smart Energy data sequence (W)

| $0^{th}$ instant | $30^{th}$ instant | $60^{th}$ instant | $120^{th}$ instant | $150^{th}$ instant |
|---|---|---|---|---|
| 114 | 137 | 137 | 152 | 134 |

The various actions, acts, blocks, steps, or the like in the flowchart 100 may be performed in the order presented, in a different order or simultaneously. Further, in some embodiments, some of the actions, acts, blocks, steps, or the like may be omitted, added, modified, skipped, or the like without departing from the scope of the invention. The method and other description provide a basis for a control program, which can be easily implemented by a microcontroller, microprocessor, or a combination thereof.

Figure 2:
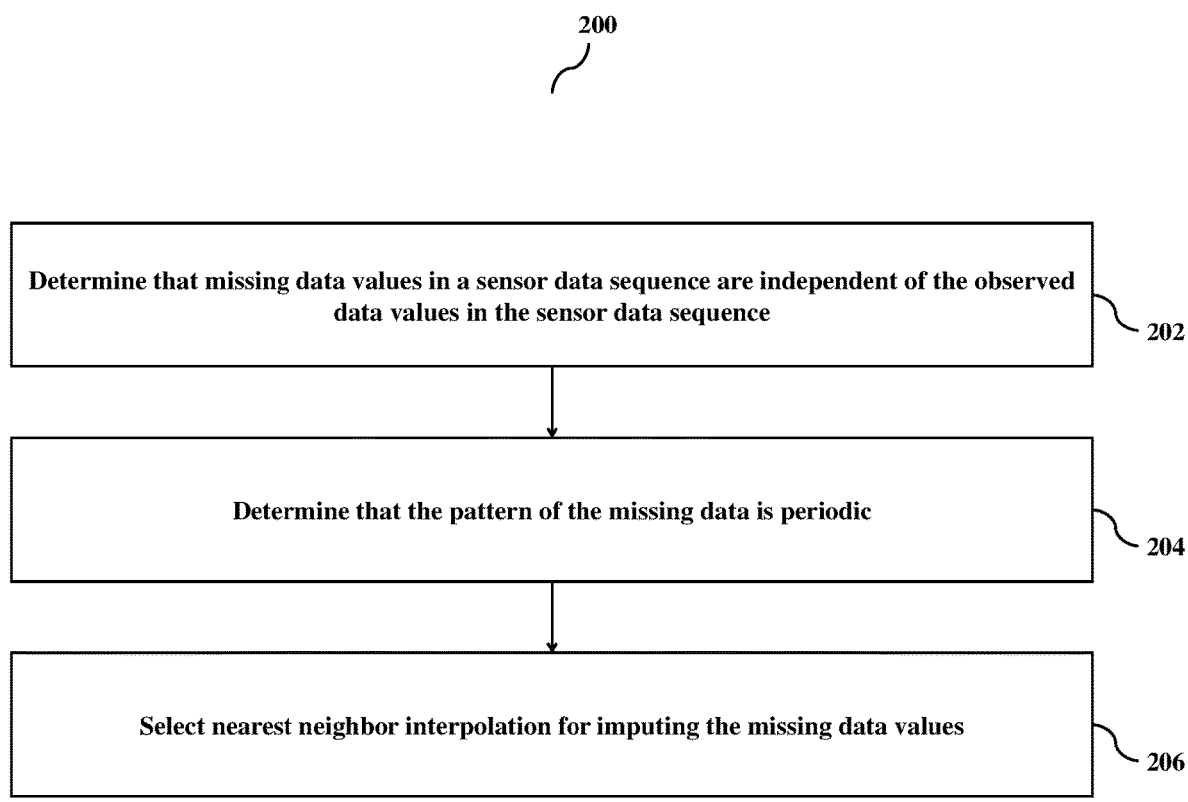
FIG. 2 is a flowchart depicting a method for imputing sensor data in a sensor data sequence with missing data, when pattern of the missing data is periodic, according to the embodiments as disclosed herein.

FIG. 2 is a flowchart 200 depicting a method for imputing sensor data in a sensor data sequence with missing data, when pattern of the missing data is periodic, according to the embodiments as disclosed herein.

At step 202, the method includes determining that missing sensor data values in the sensor data sequence are independent of the other observed sensor data values. Once the method determines that the missing sensor data values in the sensor data sequence are independent of the observed sensor data values, the method includes, at step 204, determining that the pattern of the missing sensor data values corresponds to a periodic pattern.

Considering an example, a smart energy meter and the data values generated every 30 seconds, the data value at the $90^{th}$ time instant is missing. The method determines that there is no other observable sensor data like current (I) and it is not possible to estimate the missing data value using other observed sensor data sequence. The lack of possibility is due to the fact that the observable sensor data are independent of each other, in this case MCAR (missing completely at random) in considered.

At step 206, the method includes selecting nearest neighbor interpolation for imputing the missing sensor data values after determining that the pattern of the missing sensor data considering different instances of time instants is periodic/quasi-periodic. Considering the above example, nearest neighbor interpolation is selected for imputing data value at the $90^{th}$ time instant.

The various actions, acts, blocks, steps, or the like in the flowchart 200 may be performed in the order presented, in a different order or simultaneously. Further, in some embodiments, some of the actions, acts, blocks, steps, or the like may be omitted, added, modified, skipped, or the like without departing from the scope of the invention. The method and other description provide a basis for a control program, which can be easily implemented by a microcontroller, microprocessor, or a combination thereof.

Figure 3:
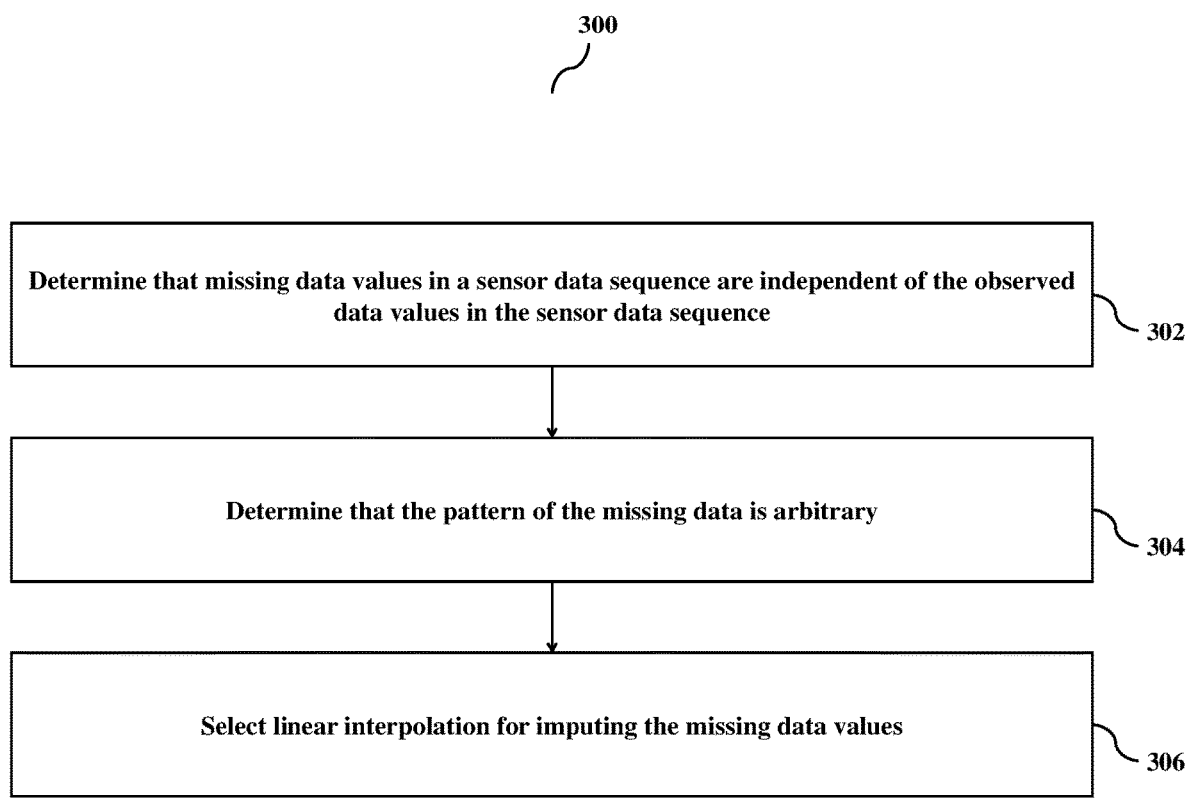
FIG. 3 is a flowchart depicting a method for imputing sensor data in a sensor data sequence with missing data, when pattern of the missing data is arbitrary, according to the embodiments as disclosed herein.

FIG. 3 is a flowchart 300 depicting a method for imputing sensor data in a sensor data sequence with missing data, when pattern of the missing data is arbitrary, according to the embodiments as disclosed herein.

At step 302, the method includes determining that missing sensor data values in the sensor data sequence are independent of the observed sensor data values in the sensor data sequence. Once the method determines that the missing sensor data values in the sensor data sequence are independent of the other observed sensor data values, the method includes, at step 304, determining that the pattern of the missing sensor data values corresponds to an arbitrary pattern.

Considering an example, a smart energy meter measures data values arbitrarily. Considering the data value at the $90^{th}$ time instant is missing. The method determines that the data values measured at other instances of time instants are observable and it is not possible to estimate the missing data value at the $90^{th}$ time instant based on the data values measured at other time instants, for example, at the $47^{th}$ time instant, $65^{th}$ time instant, or the like. The lack of possibility is due to the fact that the observable data values are independent of each other.

At step 306, the method includes selecting linear interpolation for imputing the missing sensor data values after determining that the pattern of the missing sensor data values is arbitrary. Considering the previous example, linear interpolation is selected for imputing data value at the $90^{th}$ time instant.

The various actions, acts, blocks, steps, or the like in the flowchart 300 may be performed in the order presented, in a different order or simultaneously. Further, in some embodiments, some of the actions, acts, blocks, steps, or the like may be omitted, added, modified, skipped, or the like without departing from the scope of the invention. The method and other description provide a basis for a control program, which can be easily implemented by a microcontroller, microprocessor, or a combination thereof.

Figure 4:
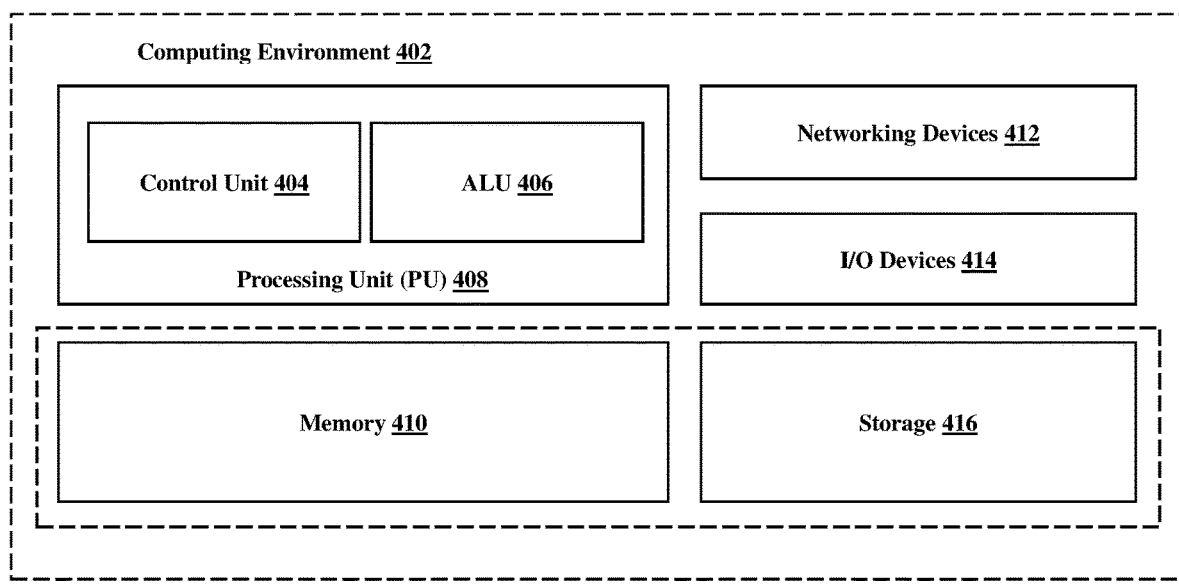
FIG. 4 illustrates a computing environment implementing the method for imputing sensor data in a sensor data sequence with missing data, according to the embodiments as disclosed herein.

FIG. 4 illustrates a computing environment implementing the method for imputing sensor data in a sensor data sequence with missing data, according to the embodiments as disclosed herein.

As depicted in the FIG. 4, the computing environment 402 comprises at least one processing unit 408 that is equipped with a control unit 404 and an Arithmetic Logic Unit (ALU) 406, a memory 410, a storage unit 416, plurality of networking devices 412 and a plurality Input output (I/O) devices 414. The processing unit 408 is responsible for processing the instructions of the technique. The processing unit 408 receives commands from the control unit in order to perform its processing. Further, any logical and arithmetic operations involved in the execution of the instructions are computed with the help of the ALU 406.

The overall computing environment 402 can be composed of multiple homogeneous and/or heterogeneous cores, multiple CPUs of different kinds, special media and other accelerators. The processing unit 408 is responsible for processing the instructions of the technique. Further, the plurality of processing units 408 may be located on a single chip or over multiple chips.

The technique comprising of instructions and codes required for the implementation are stored in either the memory unit 410 or the storage 416 or both. At the time of execution, the instructions may be fetched from the corresponding memory 410 or storage 416, and executed by the processing unit 408.

In case of any hardware implementations various networking devices 412 or external I/O devices 414 may be connected to the computing environment to support the implementation through the networking unit and the I/O device unit.

The embodiments disclosed herein can be implemented through at least one software program running on at least one hardware device and performing network management functions to control the elements. The elements shown in the FIGS. 1 and 4 include blocks which can be at least one of a hardware device, or a combination of hardware device and software module.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A method of imputing missing sensor data values in a sensor data sequence, the method comprising:
   generating the sensor data sequence over a period of time to determine behavior of a system over the period of time;
   identifying an instance of time instant associated with a missing sensor data value associated with the sensor data sequence;
   identifying a similar response data sequence corresponding to the sensor data sequence with the missing sensor data value, wherein the similar response data sequence is identified based on highest correlation with the sensor data sequence with the missing sensor data value;
   identifying a data value at an instance of time instant associated with the similar response data sequence corresponding to the instance of time instant associated with the missing sensor data value associated with the sensor data sequence;

determining nearest neighbors of the identified data value in the similar response data sequence, by searching neighbors within a predetermined nearness threshold;

determining instances of time instants of the determined nearest neighbors in the similar response data sequence;

identifying instances of time instants in the sensor data sequence with the missing sensor data value corresponding to the instances of time instants of the determined nearest neighbors in the similar response data sequence;

determining a candidate value for imputing, based on sensor data values of the identified instances of time instants in the sensor data sequence through learning based on semantics of features of the sensor data values in the sensor data sequence;

imputing the candidate value, in the instance of time instant associated with the missing sensor data value associated with the sensor data sequence using the sensor data values of the identified instances of time instants in the sensor data sequence; and determining the behavior of the system using the sensor data sequence with the imputed candidate value.

2. The method of claim 1, wherein the nearest neighbors in the similar response data sequence are determined based on a distance of data values between the nearest neighbors in the similar response data sequence and the identified data value at the instance of time instant associated with the similar response data sequence.

3. The method of claim 2, wherein a number of nearest neighbors is below a predetermined nearness threshold.

4. The method of claim 1, wherein the candidate value is determined through the learning based on semantics of features of sensor data values, wherein the semantics are defined based on constraint imposed on the features of the candidate value as well as the sensor data sequences.

5. The method of claim 4, wherein the candidate value lies within a maximum possible value and a minimum possible value associated with the sensor data values of the sensor data sequence with the missing sensor data value, and a range associated with the maximum possible value and the minimum possible value.

6. The method of claim 4, wherein the features of the candidate value, for imputing, corresponds to a distribution pattern and the constraint imposed on the distribution pattern.

7. The method of claim 6, wherein at least three consecutive sensor data values of the sensor data sequence does not have a minimum sensor data value of the sensor data sequence in between.

8. The method of claim 6, wherein the imputing of the candidate value comprises:

determining a measure of convergence of the candidate value, associated with an instance of time instant, with the sensor data values of the preceding and succeeding instances of time instants of missed value; and imputing the candidate value in the instance of time instant associated with the sensor data sequence with the missing sensor data value.

9. The method of claim 6, wherein the imputing of the candidate value comprises:

determining whether the candidate value is identical to a minimum sensor data value of the sensor data sequence with the missing sensor data value;

computing a best fit threshold by computing an average of at least the sensor data value of preceding instance of time instant, corresponding to the instance of time instant of the missed value, and the sensor data value of succeeding instance of time instant, corresponding to the time instance of the missed value, in response to determining that the candidate value for imputing is identical to the minimum sensor data value of the sensor data sequence with the missing sensor data value;

determining the candidate value, wherein the candidate value is the average of the sensor data value of the preceding instance of time instant and the sensor data value of the succeeding instance of time instant; and imputing the candidate value at the instance of time instant associated with the missing data value in the sensor data sequence.

10. A computer program product comprising computer executable program code recorded on a computer readable non-transitory storage medium where the computer executable program code when executed causing the actions which include:

generating the sensor data sequence over a period of time to determine behavior of a system over the period of time;

identifying an instance of time instant associated with a missing sensor data value associated with the sensor data sequence;

identifying a similar response data sequence corresponding to the sensor data sequence with the missing sensor data value, wherein the similar response data sequence is identified based on highest correlation with the sensor data sequence with the missing sensor data value;

identifying a data value at an instance of time instant associated with the similar response data sequence corresponding to the instance of time instant associated with the missing sensor data value associated with the sensor data sequence;

determining nearest neighbors of the identified data value in the similar response data sequence, by searching neighbors within a predetermined nearness threshold;

determining instances of time instants of the determined nearest neighbors in the similar response data sequence;

identifying instances of time instants in sensor data sequence with the missing sensor data value corresponding to the instances of time instants of the determined nearest neighbors in the similar response data sequence;

determining a candidate value for imputing, based on sensor data values of the identified instances of time instants in the sensor data sequence through learning based on semantics of features of the sensor data values in the sensor data sequence;

imputing the candidate value, in the instance of time instant associated with the missing sensor data value associated with the sensor data sequence using the sensor data values of the identified instances of time instants in the sensor data sequence;

determining the behavior of the system using the sensor data sequence with imputed candidate value.

* * * * *